United States Patent
Schmitz

(10) Patent No.: US 8,401,812 B2
(45) Date of Patent: Mar. 19, 2013

(54) TESTER, METHOD FOR TESTING A DEVICE UNDER TEST AND COMPUTER PROGRAM

(75) Inventor: Martin Schmitz, Boeblingen (DE)

(73) Assignee: Advantest (Singapore) Pte Ltd, Singapore (SG)

(*) Notice: Subject to any disclaimer, the term of this patent is extended or adjusted under 35 U.S.C. 154(b) by 1290 days.

(21) Appl. No.: 11/989,731

(22) PCT Filed: Dec. 22, 2006

(86) PCT No.: PCT/EP2006/012512
§ 371 (c)(1),
(2), (4) Date: Jan. 30, 2008

(87) PCT Pub. No.: WO2008/077429
PCT Pub. Date: Jul. 3, 2008

(65) Prior Publication Data
US 2010/0153052 A1    Jun. 17, 2010

(51) Int. Cl.
G01R 17/00    (2006.01)
G01R 17/02    (2006.01)
G01R 17/04    (2006.01)
G01R 31/02    (2006.01)

(52) U.S. Cl. ......... 702/117; 702/118; 702/120; 702/121
(58) Field of Classification Search .................. 702/117, 702/108, 118, 120, 121
See application file for complete search history.

(56) References Cited

U.S. PATENT DOCUMENTS

| | | | | |
|---|---|---|---|---|
| 5,646,521 A | * | 7/1997 | Rosenthal et al. | 324/762.02 |
| 6,101,622 A | | 8/2000 | Lesmeister | 714/724 |
| 6,154,715 A | * | 11/2000 | Dinteman et al. | 702/120 |
| 7,032,145 B1 | | 4/2006 | Burlison | 714/738 |
| 2004/0044938 A1 | * | 3/2004 | Heo | 714/738 |
| 2005/0071715 A1 | * | 3/2005 | Kolman | 714/724 |
| 2005/0251359 A1 | * | 11/2005 | Cao et al. | 702/120 |

FOREIGN PATENT DOCUMENTS

EP    0859318 A1    8/1998

* cited by examiner

*Primary Examiner* — Michael Nghiem
*Assistant Examiner* — Felix Suarez

(57) ABSTRACT

A tester for testing a device under test has a first channel unit and a second channel unit. The first channel unit has a corresponding first pin connection for a signal from a device under test, a corresponding first test processor adapted to process, at least partially, data obtained from the first pin connection, and a corresponding first memory coupled with the first test processor and adapted to store data provided by the first test processor. The first channel unit is adapted to transfer at least a part of the data obtained from the first pin connection to the second channel unit as transfer data. The second channel unit has a corresponding second test processor adapted to process, at least partly, the transfer data from the first channel unit.

24 Claims, 11 Drawing Sheets

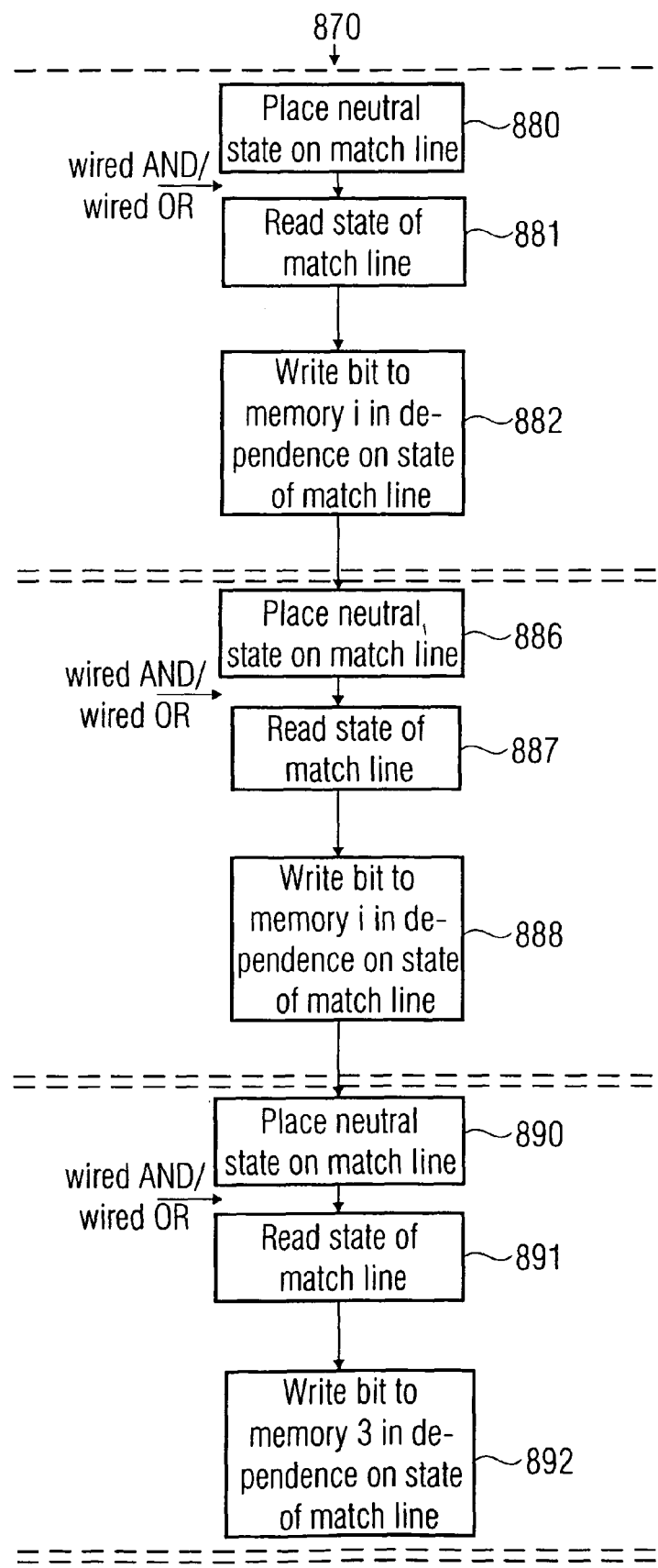

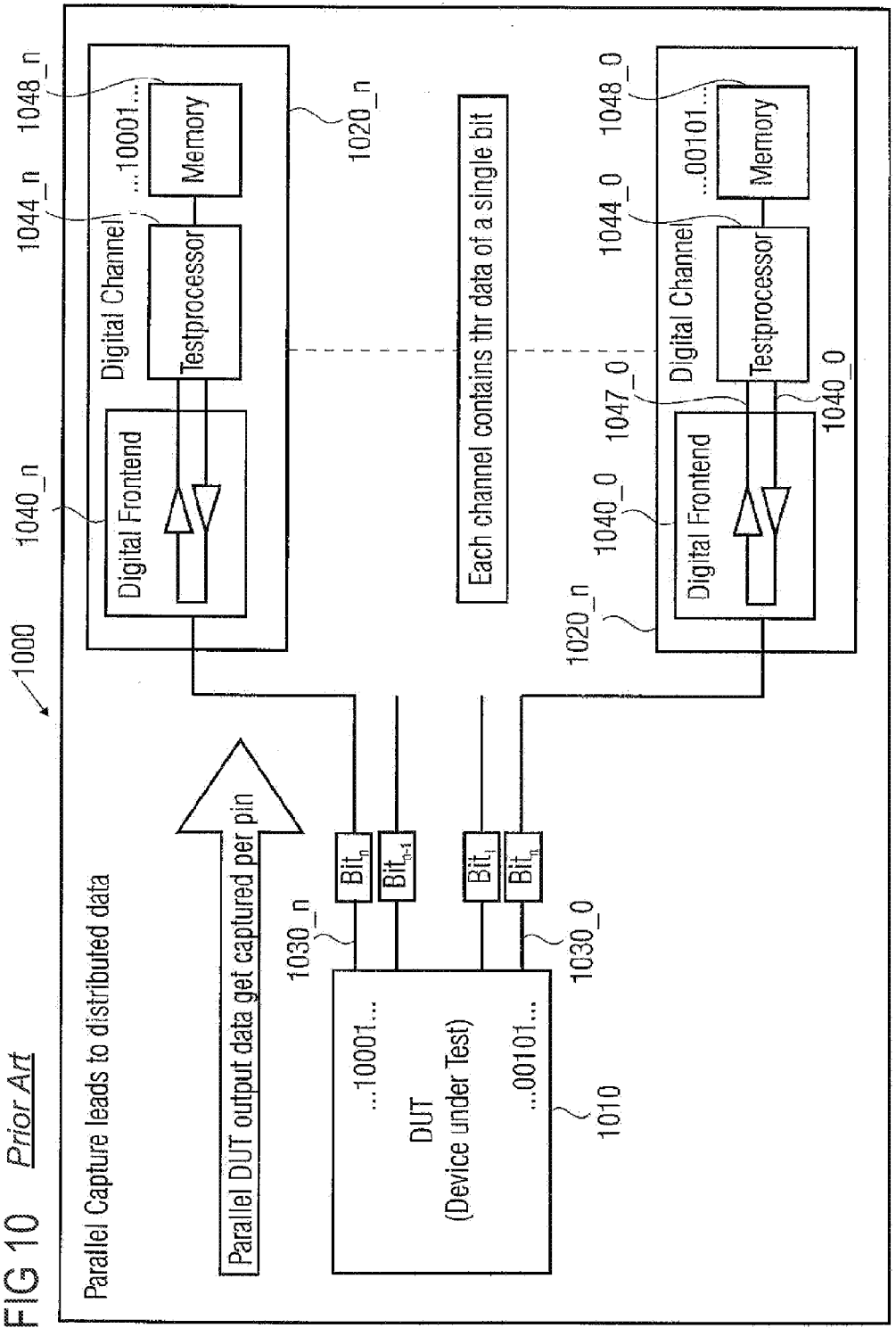
FIG 10  *Prior Art*

TESTER, METHOD FOR TESTING A DEVICE UNDER TEST AND COMPUTER PROGRAM

TECHNICAL FIELD

The present invention generally relates to a tester for testing a device under test, a method for testing a device under test and a computer program. In particular, the present invention relates to a concept enabling local and parallel processing for n-bit capture test.

BACKGROUND

In the field of testing (e.g. when testing a chip, or a loaded printed, circuit board) signals from different test pins (e.g. pins or test points of a chip, or nodes of a loaded printed circuit board) are captured using a plurality of individual channels. For example, a device under test having a plurality of test pins (input pins, output pins, input/output pins, test points or circuit nodes) is connected to a plurality of test channels. Each test channel receives information of one test pin. Moreover, each channel typically performs a processing of the data captured by the respective channel.

In the following, a conventional test system will be described with reference to FIG. 10. For this purpose, FIG. 10 shows a block schematic diagram of a test system. The test system of FIG. 10 is designated in its entirety with 1000. The test system 1000 comprises a device under test 1010 and, for example, an n+1 digital channels 1020_0-1020_n. The device under test further comprises n+1 terminals or test pins 1030_0-1030_n. Each of the test channels 1020_0-1020_n comprises a digital frontend 1040_0-1040_n, a test processor 1044_0-1044_n and a memory 1048_0-1048_n. In the following, the structure of the digital channel 1020_0 for $bit_0$ will be described.

A connection of the digital frontend 1040_0 is coupled with test pin 1030_0 of the device under test 1010 for $bit_0$. Moreover, the digital frontend $1040_0$ is coupled with the test processor 1044_0. For example, the test processor 1044_0 can output a signal $1046_0$ to the test pin 1030_0 via the digital frontend 1040_0. Moreover, the test processor 1044_0 may be adapted to receive a signal from the test pin 1030_0 via the digital frontend 1040_0. Thus, the digital frontend 1040_0 constitutes an interface between the test processor 1044_0 and the test pin 1030_0 of the device under test. Moreover, the test processor 1044_0 is coupled to a corresponding memory 1048_0.

Thus, the digital channel 1020_0 is, for example, adapted to receive a digital (or analog) pattern present at the test pin 1030_0 for $bit_0$ and to store the pattern present at the test pin 1030_0 in the memory 1048_0. Similarly, the n-th digital channel 1020_n may be adapted to receive an analog or digital pattern present at the n-th test pin 1030_ of the device under test and to store the respective pattern in the memory 1048_n. However, it should be noted that the parallel PUT output data of the device under test 1010 are captured per pin. In other words, each digital channel 1020_0-1020_n comprises or contains) the data of a single bit. In other words, each of the digital channels 1020_0-1020_n has access to only one test pin 1030_0-1030_n of the device under test 1010.

Consequently, a parallel capture of the output data of the device under test 1010 leads to a pattern of distributed data in the memories 1048_0-1048_n of the digital channels 1020_0-1020_n.

In general, it can be stated that the parallel capture of output data from devices under test leads to distributed data in automated test equipment (ATE) systems.

Further, it should be noted that in many tests (e.g. analog-to-digital converter testing, parallel protocol test) the complete data is necessary to compute test results. However, in a conventional test system the data is distributed, between the channels, and the test processor of each channel has no access to the memory of different channels. Therefore, a single test processor is not able to compute results.

To achieve best cost of test, an automated test equipment (ATE) system shall test devices under test as fast as possible. Making use of conventional concepts, having distributed data leads to increased test times. Distributed data is conventionally uploaded from the test system into a workstation, where it is combined and processed. It should be noted here that starting an upload typically brings along a latency, wherein this latency typically occurs per channel. In the case of multi-site testing (e.g. when testing several devices under test at the same time) computing of the results out of the captured data is typically serial for each site, as a workstation is not able to do parallel processing (at least not in an efficient way).

Moreover, in the case that several algorithms have to be applied to the capture data, the computation in the workstation is typically performed serially, as a workstation is typically not able to do parallel processing. Moreover, in the case that the capture data has to be applied as a stimulus for different tests, the combined data has to be downloaded to the test system again.

SUMMARY

According to an embodiment, a tester for testing a device under test may have: a first channel unit having a corresponding first pin connection for a signal from a device under test, a corresponding first test processor adapted to process, at least partially, data received from the first pin connection, and a corresponding first memory coupled with the first test processor and adapted to store data provided by the test processor; and a second channel unit; wherein the first channel unit is adapted to transfer at least a part of the data received from the first in connection to the second channel unit as transfer data, and wherein the second channel unit has a corresponding second test processor adapted to process, at least partly, the transfer data from the first channel unit.

According to another embodiment, a method for testing a device under test may have the steps of: achieving data from a first pin connection of a first channel unit; transferring at least a part of the data received from the first pin connection to a second channel unit as transfer data; processing, at least partly, data received from the first pin connection in a test processor of the first channel unit; and processing, at least partly, the transfer data from the first channel unit in a test processor of the second channel unit.

Another embodiment may have: a computer program for performing, when the computer program runs on a computer, a method for testing a device under test, the method having the steps of: achieving data from a first pin connection of a first channel unit; transferring at least a part of the data received from the first pin connection to a second channel unit as transfer data; processing, at least partly, data received from the first pin connection in a test processor of the first channel unit; and processing, at least partly, the transfer data from the first channel unit in a test processor of the second channel unit.

The present invention creates a tester for testing a device under test. The tester comprises a first channel unit and a second channel unit. The first channel unit comprises a corresponding first pin connection for a signal from a device under test, a corresponding first test processor adapted to process, at least partially, data obtained from the first pin connection, and a corresponding first memory coupled with the first test processor and adapted to store data provided by the test processor. The first channel unit is adapted to transfer at least a part of the data obtained (or captured) from the first pin connection to the second channel unit as transfer data. The second channel unit comprises a corresponding second test processor adapted to process, at least partially, the transfer data from the first channel unit.

It is the key idea of the present invention that an efficient testing of a device under test can be achieved (received) by distributing data captured by a first channel unit to a second channel unit, so that the test processor of the second channel unit has access to the data captured by the first channel unit. Thus, the inventive concept allows other channel units (e.g. the second channel unit, and further channel units) to make use of the data captured by the first capture unit. Thus, a channel unit which does not have direct access to a specific test pin gains access to the data present at the specific test pin via another test unit.

Consequently, the test processor of a specific channel unit (e.g. the test processor of the second channel unit) can have access to data signals present at a plurality of test pins of the device under test. Therefore, the test processor of the specific channel unit can execute a complex test algorithm, even if the test algorithm necessitates as input data information about the data at a plurality of test pins. Consequently, it is possible to perform a complex test algorithm within a channel unit even though the channel unit has direct access to only one test pin, or even to no test pin at all.

Consequently, the inventive concept allows the parallel evaluation of a plurality of complex test algorithms (e.g. algorithms which necessitate as input data the data at a plurality of test pins) in test processors of single-channel channel units. Consequently, optimal use can be made of the computation power of the test processors of the channel units. The need for executing complex computations in a dedicated workstation, which necessitates downloading all of the captured data to the workstation, can be avoided. Thus, a significant increase in test speed can be achieved by the inventive concept compared to test concepts where captured data is downloaded to a workstation prior to performing a complex computation. Thus, test time and test costs can be reduced significantly by applying the inventive concept.

Embodiments of the present invention are also defined by the dependent claims.

BRIEF DESCRIPTION OF THE DRAWINGS

Embodiments of the present invention will be detailed subsequently referring to the appended drawings, in which:

FIG. 8B shows the second part of a flowchart of an inventive method for exchanging captured data between channel units of a tester according to an embodiment of the present invention;

FIG. 10 shows a block schematic diagram of a conventional, prior art tester.

DETAILED DESCRIPTION

Figure 1:
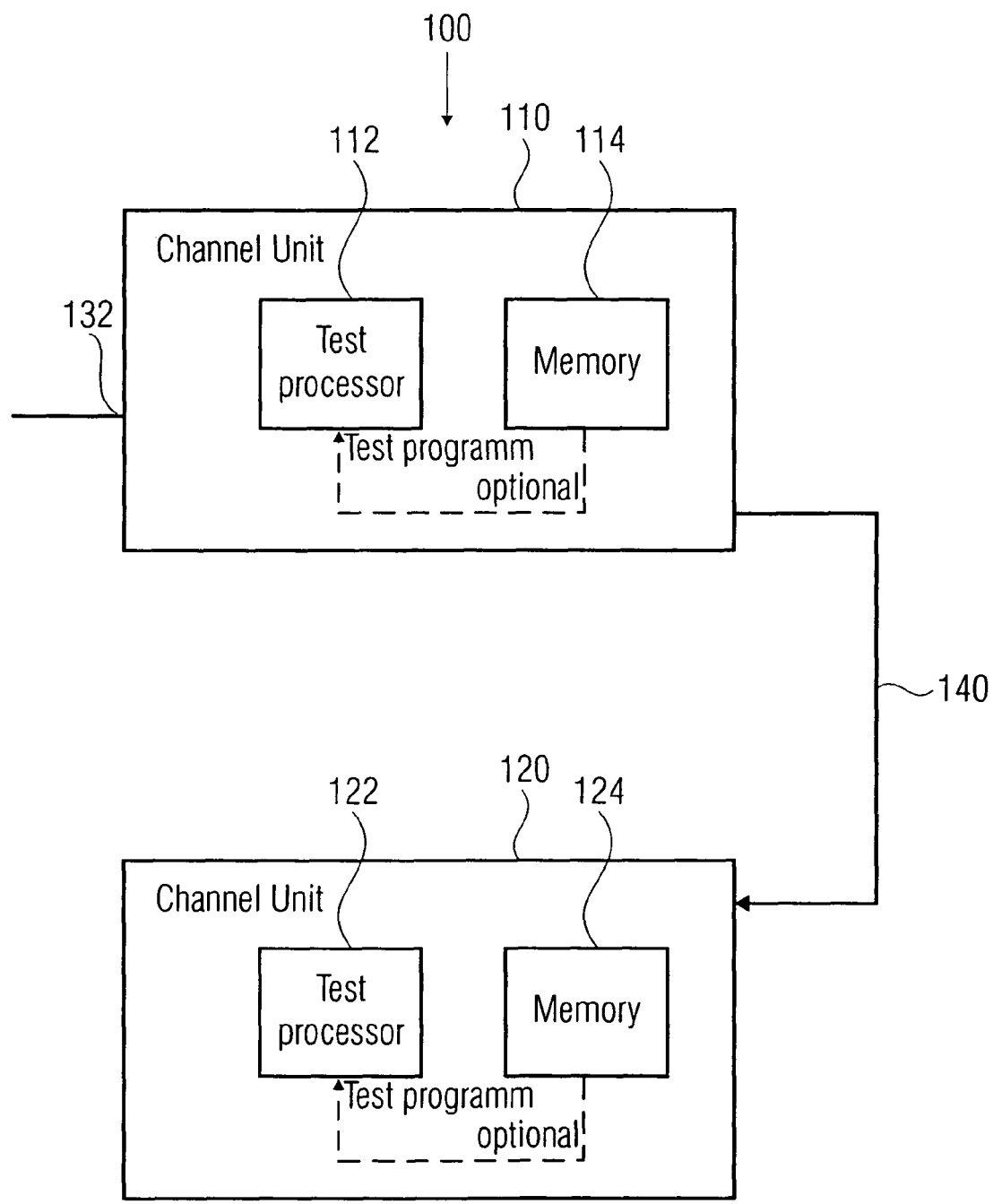
FIG. 1 shows a block schematic diagram of an inventive tester according to an embodiment of the present invention.

FIG. 1 shows a block schematic diagram of an inventive tester for testing a device under test. The tester of FIG. 1 is designated in its entirety with 100. The tester 100 comprises a first channel unit 110. The first channel unit 110 comprises a corresponding first test processor 112 and a corresponding first memory 114. The first memory 114 is coupled to the first test processor 112, and is adapted to store data provided by the first test processor 112.

The tester 100 further comprises a second channel unit 120. The second channel unit 120 comprises a corresponding second test processor 122 and a corresponding second memory 124. The second memory 124 is coupled to the second test processor 122, and is adapted to store data provided by the second test processor 122.

Moreover, the first channel unit 100 comprises a pin connection 132, which is adapted to receive a signal from a device under test not shown here.

Moreover, it should be noted that the first channel unit 110 is coupled to the second channel unit 120 via a link 140. Advantageously, the link 140 is a direct link, which connects the first channel unit 110 with the second channel unit 120. However, other types of links may be used.

Based on the above structural description, the function of the tester 100 will subsequently be described. It should be noted that the first channel unit 110 is advantageously adapted to obtain or capture data from the first pin connection 132. Thus, the first channel unit 110 may, for example, be adapted to take samples of a PUT signal, which is present at the first connection pin 132. The samples (generally: the information about the signal present at the first connection pin 132) may, for example, be provided to the test processor 112 or to the memory 114, depending on the structure of the first channel unit 110. For this purpose, the channel unit 110 may comprise, for example, an analog frontend or a digital frontend coupled with the first connection pin 132 on the one hand and the test processor 112 or the memory 114 on the other hand.

However, the test processor 112 is advantageously adapted to process, at least partially, data obtained from the first connection pin 132. Thus, the test processor 112 may, for example, perform a test algorithm making use of the data captured from the first connection pin 132 in order to provide an information whether the device under test is working properly. In other words, the first test processor 112 is advantageously adapted to process the data obtained from the first connection pin 132 to obtain an intermediate result, from which a pass-fail-result for the device under test can be calculated, or even the pass-fail-result itself.

Moreover, the first channel unit 110 is adapted to transfer at least a part of the data obtained or captured from the first pin connection 132 to the second channel unit 120 as transfer data. For this purpose, the link 140 between the first channel unit 110 and the second channel unit 120 is advantageously used.

Moreover, the test processor 122 is advantageously adapted or configured to process, at least partly, the transfer data transferred to the second channel unit 120 from the first channel unit 110.

Consequently, data can be processed in the second channel unit 120 which is not directly available for the second channel unit 120 in order to obtain, for example, an intermediate result, from which a pass-fail-result for the device under test can be computed.

It should be noted that the channel unit 120 may be adapted to obtain or capture data from an optional corresponding connection pin. In the case that the channel unit 120 comprises a corresponding connection pin, the connection pin of the second channel unit 120 is advantageously connected to a signal which is different from the signal present at the first connection pin 132 of the first, channel, unit 110. Thus, in the above-described case, the test processor 122 has access to both the data present at the first connection pin 132 of the first channel unit 110 and to the data present at the connection pin of the second channel unit. Consequently, the test processor 122 is able to combine the data transferred from the first channel unit 110 with the data obtained or captured by the second channel unit 120. This gives the second test processor 122 of the second channel unit 120 the chance to execute a complex test algorithm operating on data provided in parallel by two or more signals of the device under test, which provides an improvement in test performance over conventional testers.

Moreover, in an alternative embodiment, in which the connection pin of the second channel unit 120 is inactive, the test processor 122 of the second channel unit 120 may still be able to run a test program making use of the data transferred from the first channel unit 110. Thus, even if the channel unit 120 does not capture data from a connection pin of the second channel unit 120, the channel, unit 120 can still assist in accelerating a test by executing a test program making use of DUT signals captured by one or more other channel units (e.g. by the first channel unit 110).

From the above description it can easily be seen that the inventive concept allows for a high level, of parallelism, even if single-channel channel units are used, when each single-channel channel unit 110, 120 comprises an individual test processor 112, 122 and is adapted to be coupled with only a single signal of the device under test.

Figure 2:
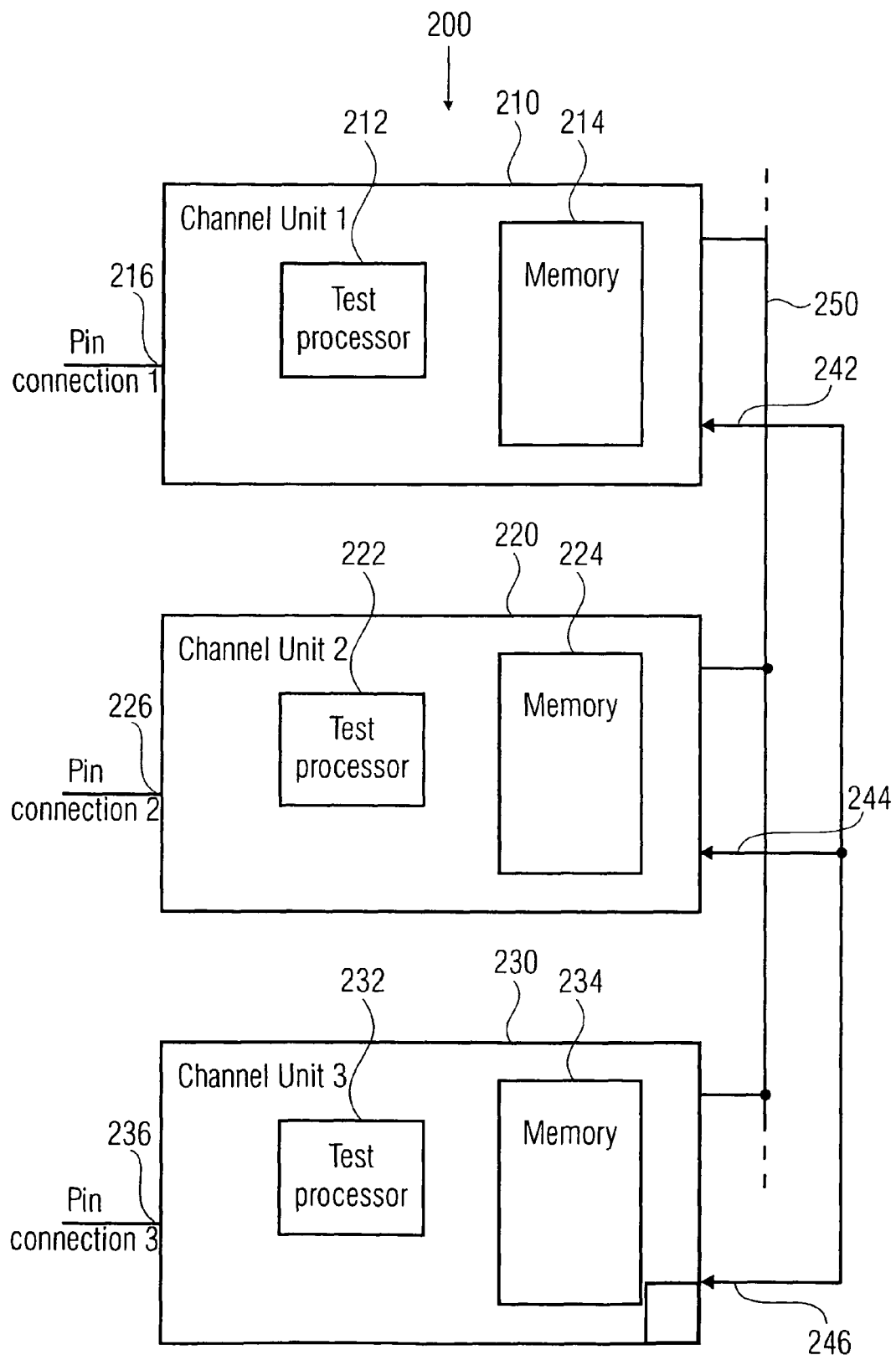
FIG. 2 shows a block schematic diagram of an inventive tester according to an embodiment of the present invention.

In the following, an exemplary architecture of an inventive test system or tester will be described. For this purpose, FIG. 2 shows a block schematic diagram of an inventive tester according to the embodiment of the present invention. The tester of FIG. 2 is designated in its entirety with 200.

The tester 200 comprises a first channel unit 210, wherein the first channel unit 210 comprises a corresponding first test processor 212, a corresponding first memory 214 and a corresponding first pin connection 216. The tester 200 further comprises a second channel unit 220. The second channel unit 220 comprises a corresponding second test processor 222, a corresponding second memory 224 and a corresponding second pin connection 226.

The tester 200 also comprises a third channel unit 230. The third channel unit 230 comprises a corresponding third test processor 232, a corresponding third memory 234 and a corresponding third pin connection 236.

It should be noted that the channel units 210, 220, 230 can, for example, be identical to the channel units 110, 120 of the tester 100. Moreover, it should be noted that the first channel unit 210 comprises an input for a first synchronization signal 242. The second channel unit 220 comprises an input for a second synchronization signal 244, and the third channel unit 230 comprises an input for a third synchronization signal 246. It should be noted that the first synchronization signal 242, the second synchronization signal 244 and the third synchronization signal 246 may be identical or may be derived from a common synchronization source or clock source. It should be noted that the channel units 210, 220, 230 are advantageously adapted to apply the corresponding synchronization signals 242, 244, 246 for synchronizing a timing of their respective test processors 212, 222, 232. Consequently, it may be assumed that the test processors 212, 222, 232 are operating in a time-synchronized way.

Moreover, the tester 200 comprises a match line 250, which may, for example, be an electrically conductive line connecting the first channel unit 210, the second channel unit 220 and the third channel unit 230. The match line may thus, for example, be considered as a bus line, to which the three channel units 210, 220, 230 are coupled. It should be noted here that the match line 250 advantageously allows for transferring data captured by the first channel unit 210 to any of the other channel units 220, 230. Moreover, the match line 250 may also allow for transferring data captured by the second channel unit 220 from the second pin connection 226 to the other channel units 210, 230. Moreover, the match line 250 may additionally or alternatively be used to transfer data captured by the third channel unit 230 from the third pin connection 236 to the other channel units 210, 220. The transfer of data between the channel units 210, 220, 230 will subsequently be described in more detail.

However, it should be noted that it is not necessary that all of the channel units 210, 220, 230 comprise a corresponding pin connections 216, 226, 236. Rather, in one embodiment only one of the channel units, e.g. the first channel unit 210, may comprise a pin connection 216. The pin connection 226, 236 of the other channel units 220, 230 may, for example, be omitted or may be deactivated by an appropriate configuration of the channel units 220, 230.

In an alternative embodiment, all the channel units 210, 220, 230 may comprise pin connections 216, 226, 236, and all the pin connections 216, 226, 236 may be activated.

Moreover, it should be noted that in an embodiment the channel units 210, 220, 230 comprise an identical hardware, wherein details of the operation of the channel units 210, 220, 230 can be configured by providing the channel units with appropriate configuration data. For example, the configuration data may decide whether signals present at the pin connections 216, 226, 236 are sampled. Thus, although using identical hardware, the individual channel units 210, 220, 230 may provide a different functionality depending on their configuration, wherein, for example, the first channel unit 210 may be adapted to sample the data at its pin connection 216, while the second channel unit 220 is adapted not to sample the signal present at its pin connection 226.

Figure 3:
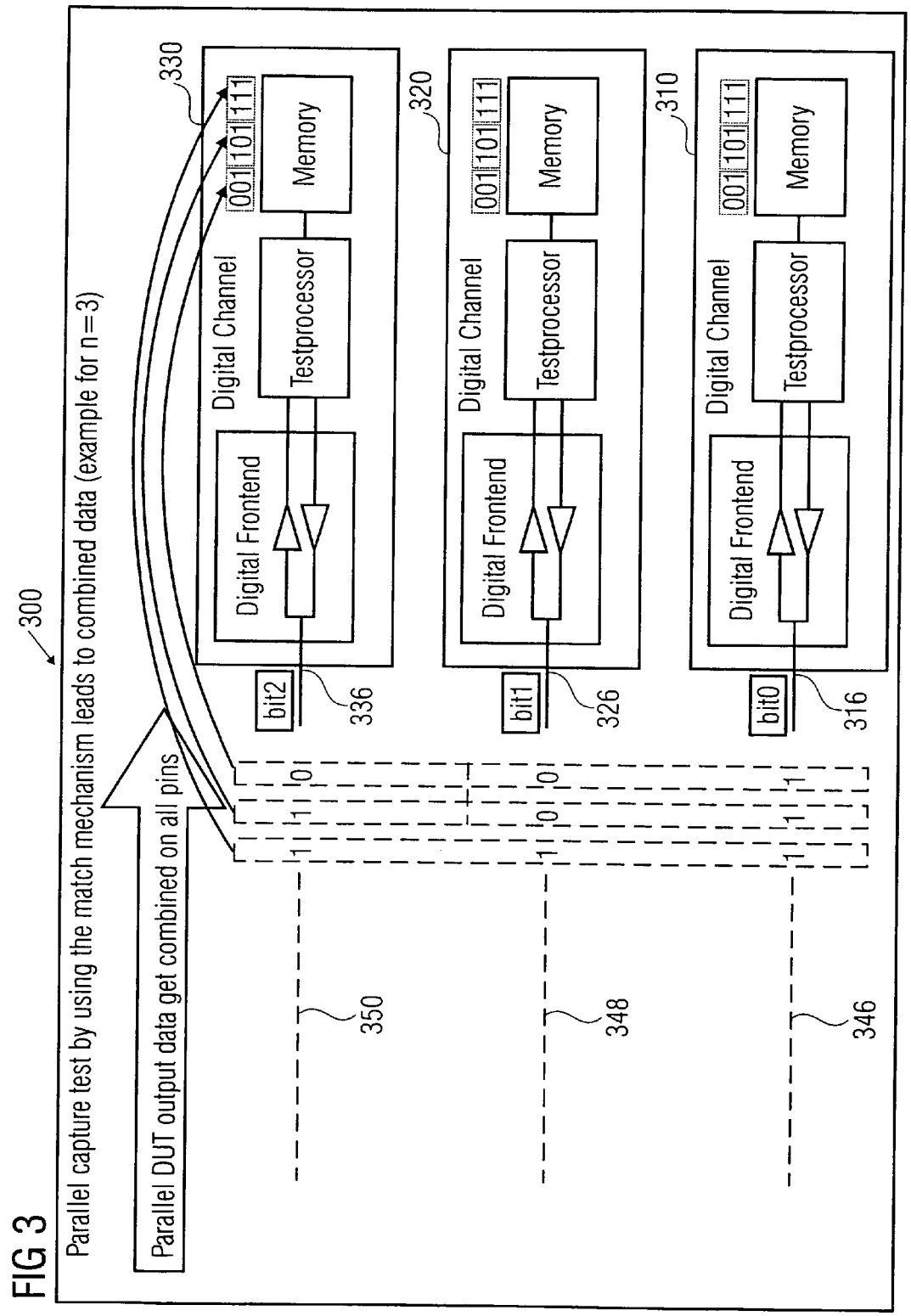
FIG. 3 shows a block schematic diagram of an inventive tester according to an embodiment of the present invention.

Further details regarding the operation of the inventive tester will be described with reference to FIG. 3. FIG. 3 shows a block schematic diagram of an inventive tester according to an embodiment of the present invention. The tester of FIG. 3 is designated in its entirety with 300. The tester 300 comprises a first channel unit 310, a second channel unit 320 and a third channel unit 330. The channel units 310, 320, 330 may be identical to the channel units 210, 220, 230 described with reference to FIG. 2. A connection pin 316 of the first channel unit 310 is connected to a first signal 346 of a device under test. It should be noted that the first signal 346, for example, comprises a sequence "111" of logical values. Moreover, a second connection pin 326 of the second channel unit 320 is connected to a second signal 348 of the device under test. The second signal 348 represents, for example, a sequence "100" of logical values. A third connection pin 336 of the third channel unit 330 is connected to a third signal 350 of the device under test, wherein the third signal 350 of the device under test represents, for example, a sequence "110" of logical values. It should further be noted that the first signal 346 represents, for example, a least significant bit "$bit_0$" of the parallel DUT output data. The second signal 348 represents, for example, a first bit "$bit_1$" of the parallel DUT output data, and the third signal 350 represents; for example, a second bit "$bit_2$" of the parallel DUT output data. In the following, when a parallel sequence of bits is represented, the least significant bit will be given as the rightmost bit. Furthermore, when a temporal sequence of bits is given, the first bit will be the leftmost bit, and the last bit will be the rightmost bit. It should be noted that the three signal 346, 348, 350 represent a parallel word of bits. At a first instance of time, the signals 346, 348, 350 represent the word "111", at a second instance of time the three signals represent the parallel word "101" and at a third instance of time the three signals 346, 348, 350 represent the parallel word "001". It should be noted that the first channel unit 310 is advantageously a single channel unit. Therefore, the first channel unit 310 comprises only a single DUT terminal, namely the connection pin 316. The connection pin 316 is coupled to the first signal 346. Consequently, the first channel unit 310 receives the signal of one DUT pin, namely the signal 346, from the DUT. Similarly, the second channel unit 320 comprises only a single DUT terminal, namely the second connection pin 326. As a consequence, the second channel unit 320 receives only a single signal, namely the signal 348, from the DUT. Similarly, the third channel unit 330 is a single-channel channel unit, comprising only a single DUT terminal, namely the third connection pin 336. At the third connection pin 336 the third channel unit 330 receives the signal 350 from the DUT. However, there is a coupling or interface between the three channel units 310, 320, 330, which allows the channel units to exchange captured data. Consequently, it is possible to distribute the captured analog or digital data (e.g. captured bits) between the channel units 310, 320, 330, so that as a result each of the channel units 310, 320, 330 has in its memory all the data words transported via the three DUT signals 346, 348, 350. As can be seen from FIG. 3, after exchanging the captured data, all the channel units have stored in their respective memories the three data words "111" and "101" and "001".

Thus, from FIG. 3 it can be seen that parallel DUT output data are combined on all pins or single-pin channel units. In other words, a parallel capture test by using a match mechanism leads to combined data, which is shown in FIG. 3 for an example with n=3 channels or channel units.

However, it should be noted that in an alternative embodiment it may be sufficient to capture the signal from only a single DUT test pin. For example, it may be sufficient to capture the signal 346 making use of the first channel unit 310. In this case, the connection pins 326, 336 of the second channel unit 320 and the third channel unit 330 are inactive. Thus, a single sequence, namely the sequence "111" of the first signal 346 is captured and distributed among the channel units. Thus, the sequence "111" captured by the first channel unit 310 is available to the second channel unit 320 and the third channel unit 330. Consequently, all three channel units 310, 320, 330 (e.g. the test processors thereof) can perform test algorithms on the basis of the data captured via the first channel unit 310.

Moreover, in an alternative embodiment it might be recognized that a specific data word captured from the device under test is of no relevance, for example because it is only a frame word or a synchronization word, but does not carry the desired information, in this, case, the information (e.g. the bits) of the non-necessitated DUT data word do not need to be distributed across the channel units 310, 320, 330. Assuming here, for example, that the DUT data word "111" can be recognized by the channel units 310, 320, 330 to be a synchronization word, either by its temporal position or, making use of a more advanced data stream analysis algorithm, distribution of the respective data word or bits "111" across the channel units 310, 320; 330 may be omitted. The omission of the distribution is controlled for example via a non-useful-data-word-detection algorithm (e.g. a synchronization word detection algorithm, or a synchronization bit detection algorithm). However, alternatively, it may be known that at a certain temporal position within a test program a non-useful-data-word (or a non-useful-data-bit) will occur and, consequently, an instruction for a distribution of the respective bits among the channel units 310, 320, 330 can be omitted. The omission can either be on the transmit side or on the receive side.

If the omission is triggered or initiated by the transmit side, the transfer of a non-useful-data-word or a non-useful-data-bit may be omitted. If the omission is caused by the receive side, the receiving channel units can be adapted to neglect (not to receive or not to store) a non-useful-data-bit or a non-useful-data-word, even if it is transmitted by a transmitting channel unit.

Moreover, in an alternative embodiment an exchange of captured DUT output data does not need to occur among all the available channel units. For example, it may be decided that the third channel unit 330 does not receive data captured by the first channel unit 210 and the second channel unit 320 while still transmitting its own captured data to the first channel unit 310 and the second channel unit 320. Thus, after the exchange of data, the first channel unit 310 and the second channel unit 320 may have available data captured by all three channels 310, 320, 330, while the third channel unit 330 only has available its own captured data.

In an alternative embodiment, there may be an individual selection of which captured data bits are distributed to which channel units. For example, a first set of data bits captured by a certain channel unit may be transferred to a first receiving channel unit, and a second, subsequent or temporally shifted set of b data bits may be transferred from the certain channel unit to another receiving channel unit. In other words, it can be flexibly decided on a per-bit basis, which of the captured data bits are distributed to which channel units.

Figure 4:
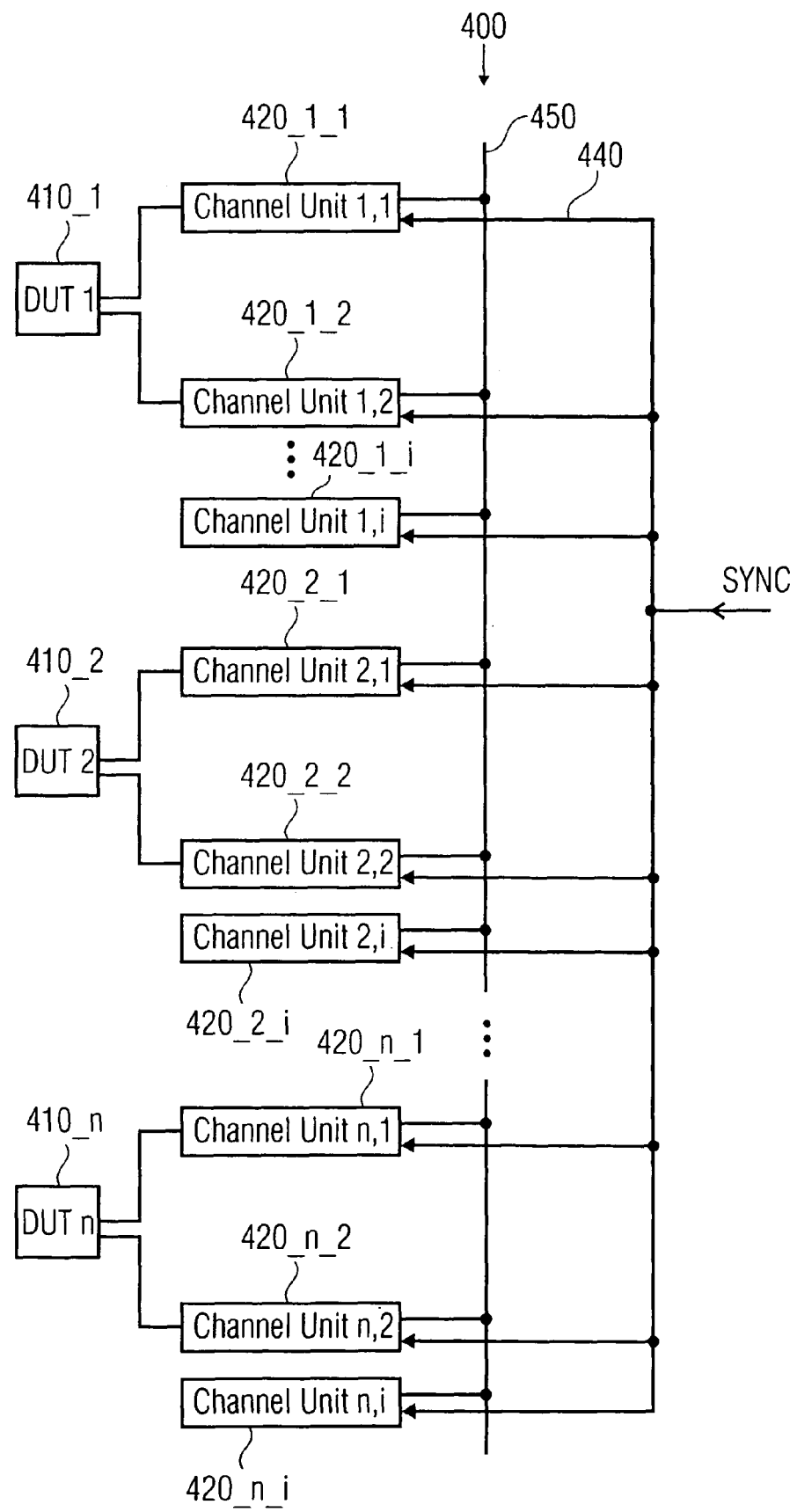
FIG. 4 shows a block schematic diagram of an inventive tester according to an embodiment of the present invention.

In the following, further details about the distribution of captured bits will be described. For this purpose, FIG. 4 shows a block schematic diagram of an inventive tester according to an embodiment of the present invention. The tester of FIG. 4 is designated in its entirety with 400. The tester 400 comprises a plurality of channel units, for example n×i channel units. Advantageously, the channel units are single-channel channel units, having a single connection pin for establishing a connection to a DUT signal.

It should be noted that the channel units are grouped into hardware sites, where each hardware site is, for example, responsible for the test of a single device under test or for a test of an individually testable component of the device under test. In the example of FIG. 4, it is assumed that n identical devices 410_1-410_n are tested simultaneously. A first hardware site comprises i channel units 420_1_1-420_1_i, and an n-th test site comprises i channel units 420_n_1-420_n_i. It should be noted that all of the channel units considered here (i.e. the channel units of at least two hardware sites) receive a synchronization signal 440 which is derived from a single synchronization source. In an embodiment, all the channel units 420 (or at least the channel units of two hardware sites) receive the same synchronization signal 440. It should be noted that advantageously all the channel units 420 (at least the channel units of two hardware sites) are coupled to a common match line 450. It should be noted that the channel units are advantageously coupled via tri-state drivers, open source drivers or open drain drivers to the match line 250, so that the channel units can be brought into a state in which they do not have significant impact on a signal level of the match line (neutral state).

Figure 5:
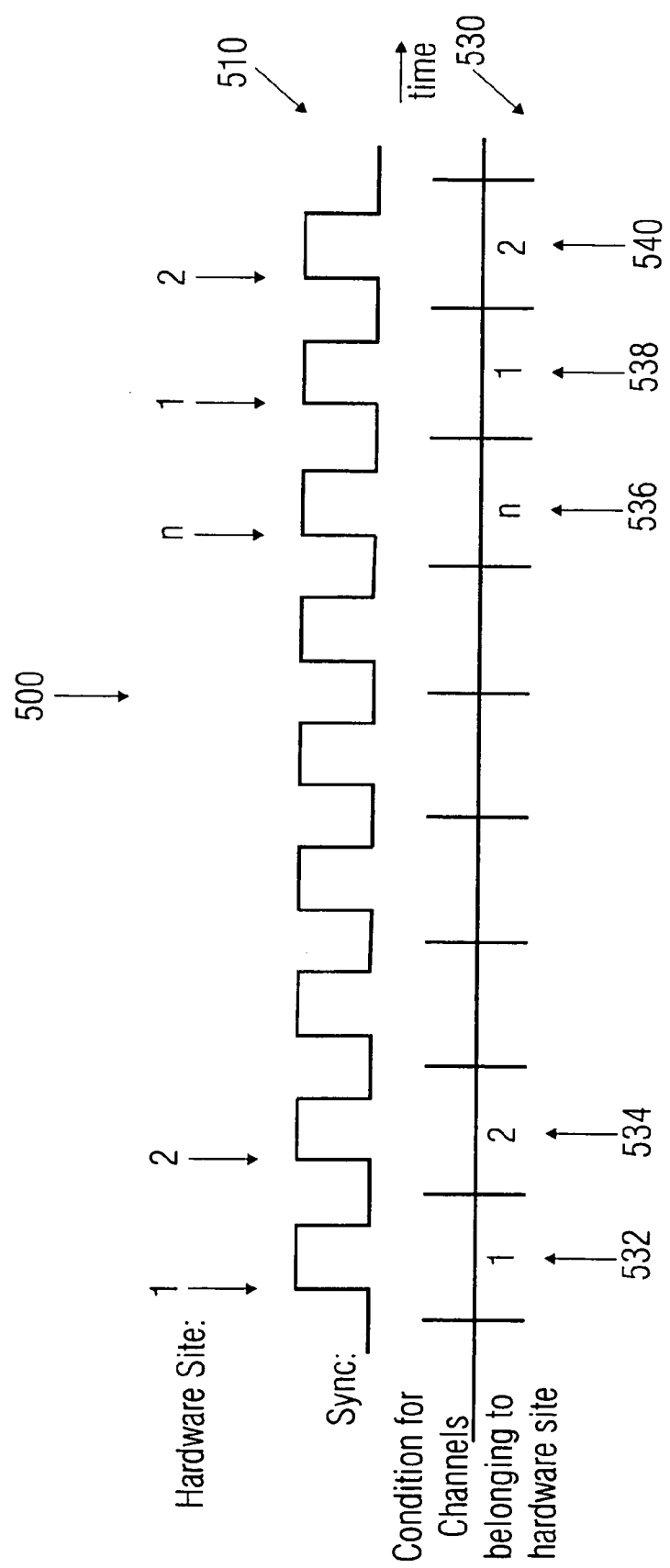
FIG. 5 shows a graphical representation of a timing in an inventive tester according to an embodiment of the present invention.

In the following, the exchange of captured data between channel units will be described in detail. For this purpose, FIG. 5 shows a graphical representation of a synchronization signal "Sync" and of the synchronization intervals. The graphical representation of FIG. 5 is designated in its entirety with 500. A first graphical representation 510 shows a temporal evolution of a synchronization signal, e.g. of the synchronization signal 440. It should be noted that the synchronization signal 440 is shown in an idealized way as a square wave signal. Each edge of the synchronization signal 440 is associated to a hardware site, i.e. to a group of channel units. Also, each period of the synchronization signal 440 is associated with a hardware site, which is shown in the second graphical representation 530. In other words, a first period 532 of the synchronization signal 440 is associated with channel units belonging to a first hardware site. A subsequent second period of the synchronization signal 440 is associated with channel units belonging to a second hardware site. An n-th period 536 of the synchronization signal 440 is associated with an n-th hardware site. Moreover, the association between synchronization signal periods and hardware sites is advantageously repetitive, so that an (n+1)-th period 538 of the synchronization signal 440 is associated again with channel units belonging to the first hardware site. Consequently, there is a sequence of periods of the synchronization signal 440, wherein there is an association between periods of the synchronization signal 440 and hardware sites. An association between a period of the synchronization signal and the hardware site means that a channel module of the hardware site may use the match line 450, while the channel units of the other hardware sites need to behave in a neutral way with respect to the match line 450.

As an example, the channel units 420_1_1-420_1_i are allowed to make use of the match line 450 (i.e. to put a signal on the match line 450) during the first synchronization interval 532, the (n+1)-th synchronization interval 538, the (2n+1)-th synchronization interval, and so on (in general: during the (kn+1)-th synchronization interval, with k=−1, 2, 3, . . . ). During the other synchronization intervals (e.g. during the $2^{nd}$, $3^{rd}$, . . . , n-th synchronization interval) the channel units of the first hardware site need to behave neutrally with respect to the match line 450.

Moreover, the second hardware site (e.g. the corresponding channel units 420_2_1-420_2_i) may access the match line during the second synchronization interval 534, the (n+2)-th synchronization interval 540, and so on. During other synchronization intervals, the channel unit of the second hardware site should behave neutrally with respect to the match line 450. Consequently, a time-sliced mechanism is implemented, wherein during each synchronization interval (or synchronization period) only one singe hardware site may access the match line 450, while the other hardware sites behave neutrally with respect to the match line 450. Moreover, it should be noted that in an embodiment, during a single synchronization interval or synchronization period, only one single data symbol can be exchanged between channel units of a hardware site. It should be noted here that this may be realized by granting access to only one single channel unit during a single synchronization interval. Alternatively, all the channel units of a hardware site may have access to the match line 450 during one single synchronization interval, wherein a wired AND or a wired OR operation is performed by the match line 450. Thus, as multiple channel units of a hardware site access the match line 450 during one single synchronization interval, the value of the match line will be determined by an AND operation or an OR operation of the values provided to the match line 450 by the channel units. However, it should be noted that a channel unit can behave neutrally with respect to the match line 450 by placing its match line output into a high-impedance state. If the match line 450 performs a wired AND operation, the channel unit can further behave neutrally with respect to the match line if its match line output is set to a logical value of "1". In contrast, if the match line 450 performs a wired OR operation, the channel behaves neutrally with respect to the match line if it places its match line output in a logical "0" state.

In the following, an algorithm for exchanging captured data between channel units via a match line 450 will be described. Here, it will be assumed that a wired AND operation is performed by the match line 450. Moreover, it is assumed that the involved channel units access the match line 450 in time intervals which are associated to them, so that no collisions occur.

Figure 6:
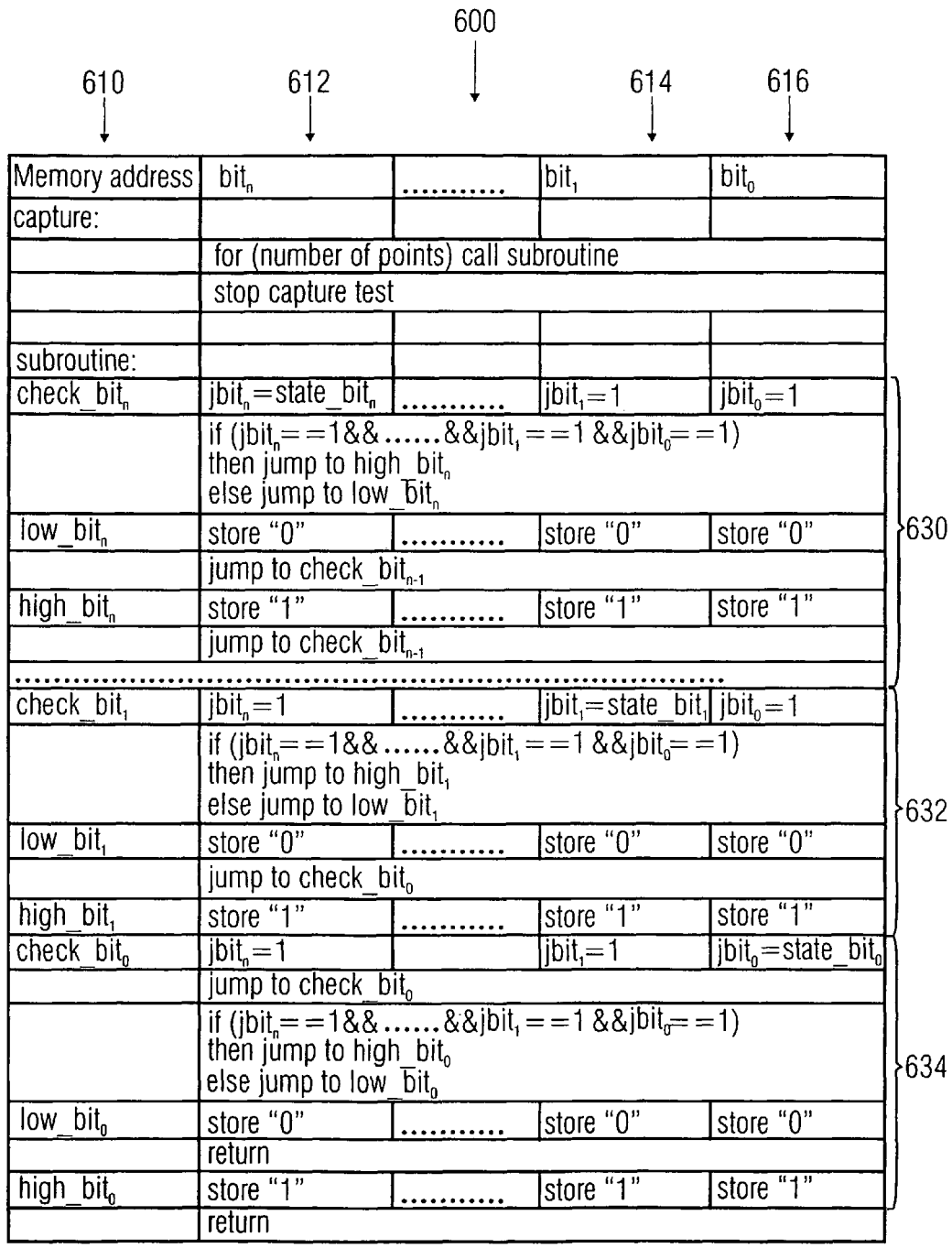
FIG. 6 shows a program listing of an inventive program for exchanging captured data between different channel units according to an embodiment of the present invention.

FIG. 6 shows a program listing of a computer program which may be executed in the test processors of a plurality of channel units. The computer program of FIG. 6 is designated in its entirety with 600. Moreover, reference is also made to FIG. 8A, which shows a flowchart of the inventive computer program.

It is to be noted that the computer program 600 shows a parallel processing in a set of n+1 channel units which are coupled via a match line, as described with reference to FIG. 4. The first column of the computer program 600 describes labels of memory addresses. The first column is designated with 610. A second column 612 describes operations executed in an n-th channel unit. A third column 614 describes operations executed in a first channel unit, and a fifth column 616 describes operations executed in a 0-th channel unit. It should be noted that it is assumed that usually the n-th channel module has stored in its memory a captured data value "bit.sub.n". The first channel unit has stored in its memory a captured information "bit.sub.1" and the 0-th channel unit has stored in its memory a separate information "bit.sub.0".

As soon as the captured information is stored in the memory, a subroutine is called. Thus, a memory address "check_bit$_n$" is reached. At this point in time, the channel units access the match line 450 by placing on the match line respective values. For example, the n-th channel unit places the information "bit$_n$" on the match line 450, which is indicated by the statement "jbit$_n$=statebit$_n$". The other channel units place a neutral state on the match line 450, for example a logic "1", which is indicated by the instructions "jbit$_1$=1" and "jbit$_0$=1". Thus, only the n-th channel unit places data stored in its memory on the match line 450, while the other channel units place neutral data on the match line 450 or deactivate their match line outputs.

Subsequently a wired AND operation occurs on the match line 450, so that the state of the match line is effectively determined by information put on the match line 450 by the n-th channel unit. In a subsequent instruction, all the channel units read in the state of the match line 450. Dependent on the state of the match line 450, the channel units store the logic value of "0" and/or the logic value of "1" in their respective memories. This operation is indicated by the "if then . . . else . . ." statement, wherein the condition of the if-statement is the state of the match line 450. Thus, a first portion 630 of the computer program 600 allows the transfer of a captured bit from the n-th channel unit to the other channel units.

Subsequently, in a second portion 632 of the computer program 600, information acquired by the first channel unit is transferred to the other channel units. Moreover, in a third portion 634 of the computer program 600, information acquired by the 0-th channel unit is transferred to the other channel units. Similar instructions are used when compared to the first portion 630 of the computer program 600. However, the instruction "$jbit_1=state\_bit_1$" indicates that the first channel unit outputs the acquired information on the match line. Moreover, the instruction "$jbit_0=state\_bit_0$" indicates that the 0-th channel unit applies its acquired information (acquired from the connection pin) to the match line.

Besides, the instruction "$jbit_n=1$" indicates that the n-th channel unit applies a neutral information to the match line, or behaves neutrally with respect to the match line.

Figure 8A:
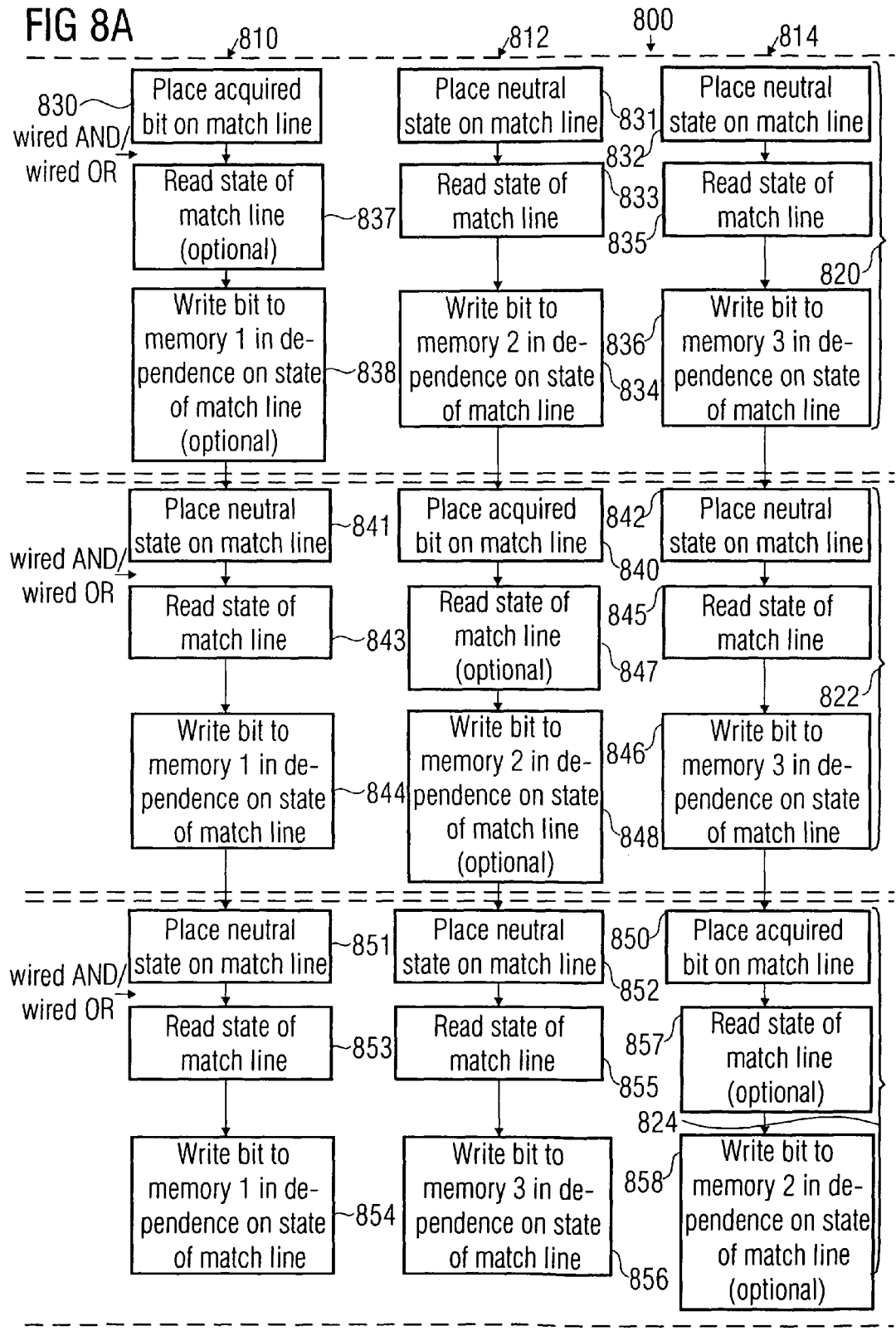
FIG. 8A shows the first part of a flowchart of an inventive method for exchanging captured data between channel units of a tester according to an embodiment of the present invention.

It should be noted here that the algorithm of the program 600 is represented in FIG. 8a in a plain text form. The algorithm of FIG. 8A is designated in its entirety with 800. It should be noted that the instructions shown in the first column 810 may be executed in a first channel unit, while the instructions shown in the second column 812 are executed in a second channel unit, and the instructions shown in the third column 814 are executed in a third channel unit. It should also be noted that the instructions of the first column 810, the second column 812 and the third column 814 may be executed in a time-synchronized way in different channel units. Moreover, it should be noted that the instructions of the first block 820 of instructions are advantageously executed in a first synchronization interval associated to the respective hardware site, to which the involved channel units belong wherein the instructions of the second block 822 of instructions are advantageously executed during a second synchronization interval associated with the respective hardware site. The instructions of a third block 824 of instructions are advantageously executed during a third, subsequent synchronization interval associated with the hardware site.

With reference to FIG. 3, the instructions of the first block 820 of instructions may, for example, be executed during the synchronization interval 532, while the instructions of the second block 822 of instructions may, for example, be executed during the synchronization interval 538.

It should be noted that during the first block 820 of instructions, a first channel unit places a bit acquired by the first channel unit from the device under test on the match line in step 830. During the same synchronization time interval, the second channel unit and the third channel unit place a neutral state on the match line in steps 831 and 832. Moreover, the second channel unit reads the state of the match line in step 833 and writes a bit to its memory in dependence on the state of the match line in step 834. In parallel, the third channel unit reads the state of the match line in step 835 and writes a bit to its memory in dependence on the state of the match line in step 836.

Optionally, also the first channel unit reads the state of the match line in step 837 and writes a bit to its memory in dependence on the state of the match line in step 838. During the second block 822 of instructions, the second channel unit places an acquired bit on the match line in a step 840, while the first channel unit and the third channel unit act as listeners in steps 841, 842, 843, 844, 845, 846 by placing a neutral state on the match line, reading the state of the match line and writing a bit to their respective memories in dependence on the state of the match line. Again, the second channel unit may also, optionally, read the state of the match line and write a bit to its memory in steps 847, 848.

During the third block 824 of instructions the third channel unit transfers a bit acquired from the DUT by the third channel unit to the first channel unit and the second channel unit, as shown by steps 850-858.

It should be noted that in an alternative embodiment some of the operations may be cancelled. For example, if a bit acquired by a certain channel unit is not relevant, the transfer of the respective bit can be omitted. If, for example, the bit acquired by the first channel unit is not relevant, the instructions of the block 820 can be omitted. If the bit acquired by the second channel unit is not relevant, the instructions of the second block 822 can be cancelled, and if the bit acquired by the third channel unit is not relevant, the instructions of the third block 824 can be cancelled.

Moreover, not every channel unit may need to receive all the bits. For example, the first channel unit may not need to receive bits acquired by the second channel unit. In this case, steps 843 and 844 may be omitted. If the first channel unit does not need to receive bits acquired by the third channel unit, step 853 and 854 may be omitted. Similarly, steps 833 and 834 and/or steps 855, 856 may be omitted. Furthermore, steps 835, 836 and/or steps 845, 846 may be omitted.

Moreover, it should be noted that the transmission of non-necessitated bits, i.e. placing an acquired bit on the match line, may be omitted. Also, receiving a non-necessitated bit, i.e. reading the state of the match line and writing a bit to the memory dependent on the state of the match line, may be omitted, wherein an arbitrary choice can be made which bits need to be transmitted and which bits need to be received by which channel unit.

Figure 7:
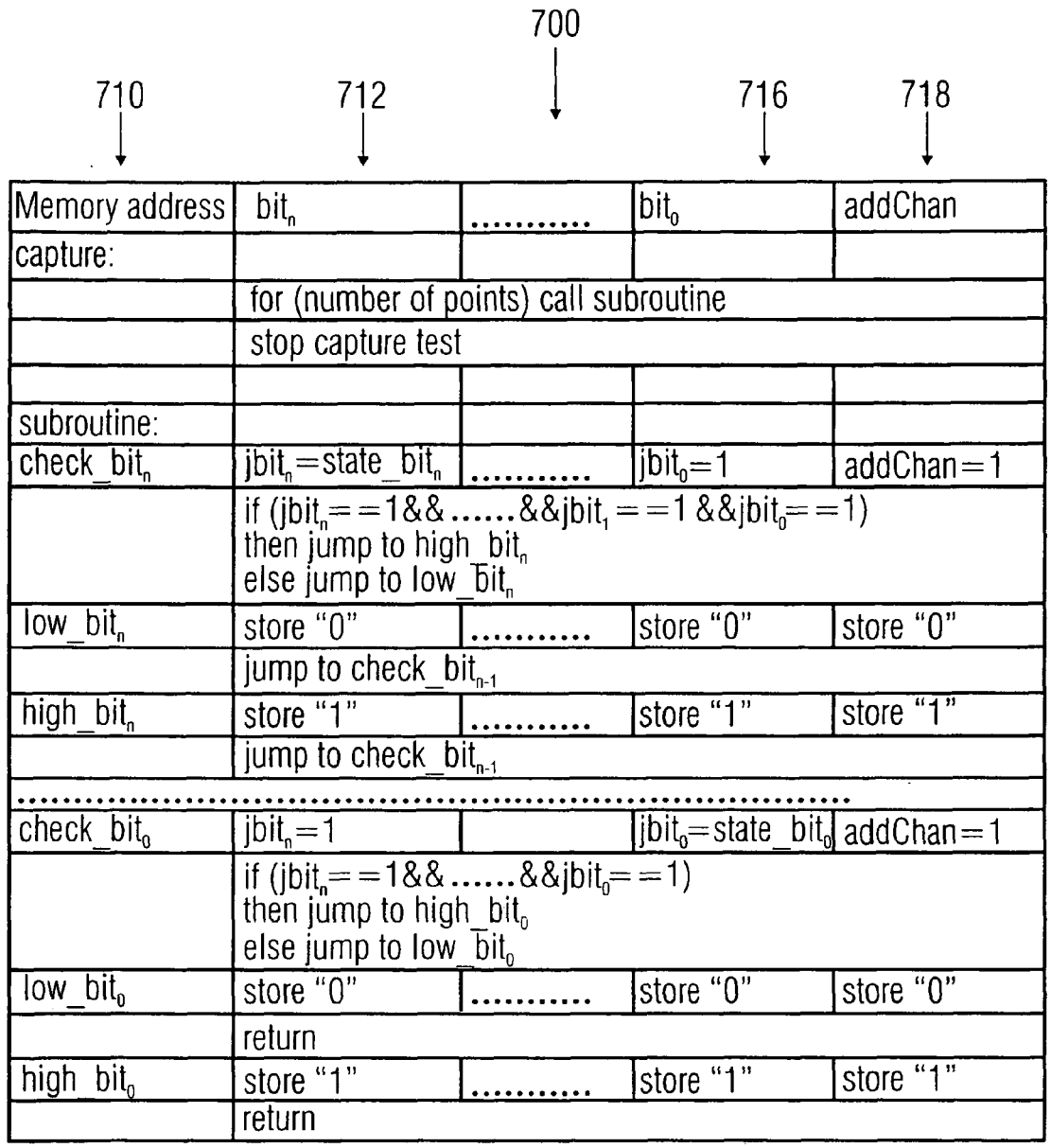
FIG. 7 shows a program listing of programs for exchanging captured data between channel units with an inventive tester according to an embodiment of the present invention.

In the following, an extension of the inventive algorithm will be described with reference to FIGS. 7, 8 and 8B. For this purpose, FIG. 7 shows a program listing of an inventive computer program for transferring acquired bits from one channel module to another. The computer program of FIG. 7 is designated in its entirety with 700. It should be noted that the computer program 700 of FIG. 7 is very similar to the computer program 600 of FIG. 6, so that only differences will be explained here. It should be noted that a first column 710 represents a memory address, similar to the first column 610. A second column 712 represents operations performed by an n-th channel module, which is adapted to capture a signal of a DUT. The fourth column 716 represents operations performed by a 0-th channel unit. Thus, the operations described in the fourth column 716 are equivalent to the operations described by the column 616 of the computer program 600. However, the computer program 700 describes in a fifth column 718 operations performed by an additional channel unit, which is, in an embodiment, configured not to capture data from the device under test via a GUT connection pin. Therefore, the additional channel module 718 only performs instructions to receive data captured by the other channel units, but does not perform any instructions to send acquired data to the other channel units.

Details of the operation of the additional channel unit are described in FIG. 8B. For this purpose, FIG. 8B shows a flowchart of an inventive method which is executed in the additional channel unit. The representation of FIG. 8B is designated in its entirety with 870. It should be noted that the method of FIG. 8B may be seen as a supplement to the method shown in FIG. 8A. In other words, the steps shown in the flowchart 870 of FIG. 8B may be performed in parallel and in a time-synchronized way with the steps shown in columns 810, 812, 814 of the flowchart 800. Thus, the steps 880, 881, 882 may be performed in parallel and in a time-synchronized way with steps 830-838. Moreover, steps 886, 887 and 888 may be performed in parallel in a time-synchronized way along with steps 840-848. Moreover, steps 890, 891 and 892 may be performed in parallel in a time-synchronized way along with steps 850-858.

Thus, an inventive method combining the steps shown in FIGS. 8A and 8B allows a full exchange of captured data between the first channel unit, the second channel unit and the third channel unit. Moreover, the data-captured by the first channel unit, the second channel unit and the third channel unit are transferred to the additional channel unit which does not capture data from the device under test by itself.

In the following, a simplified version of the inventive concept will be described with reference to FIG. 9.

Figure 9:
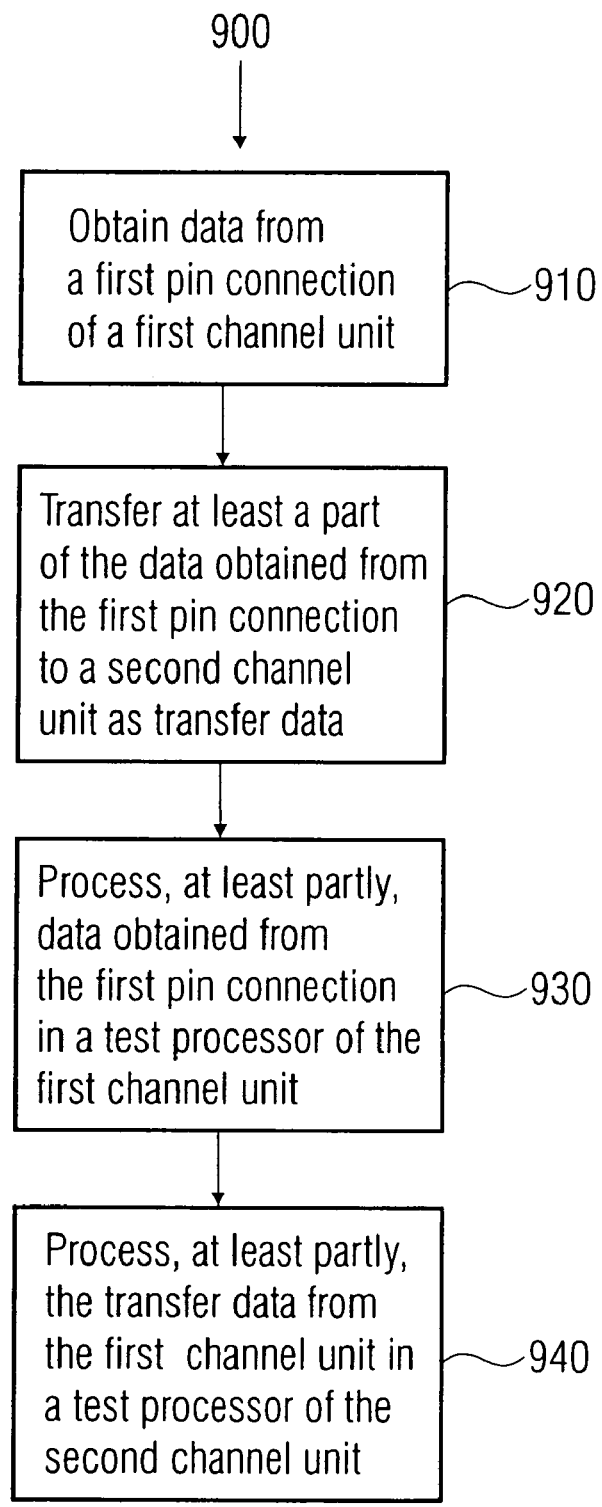
FIG. 9 shows a flowchart of an inventive method for testing a device under test according to an embodiment of the present invention.

FIG. 9 shows the flowchart of an inventive method for testing a device under test. The method of FIG. 9 is designated in its entirety with 900. The method 900 comprises a first step of obtaining data from a first pin connection of a first channel unit. The method 900 further comprises a second step 920 of transferring at least a part of the data obtained from the first pin connection to a second channel unit as transfer data. The method 900 comprises a third step 930 of processing, at least partly, data obtained from the first pin connection in a test processor of the first channel unit.

Moreover, the method 900 comprises a fourth step 940 of processing, at least partly, the transfer data from the first channel unit in a test processor of the second channel unit.

It should be noted that the method 900 of FIG. 9 can be supplemented by any of the steps described with reference to the inventive concept.

Depending on certain implementation requirements of the inventive methods, the inventive methods can be implemented in hardware or in software. The implementation can be performed using a digital storage medium, for example a disk, DVD CD, ROM, PROM, EPROM, EEPROM or FLASH memory having electronically readable control signals stored thereon, which cooperate with a programmable computer system such that the inventive methods are performed. Generally, the present invention is, therefore, a computer program product with a program code stored on a machine readable carrier, the program code being operative for performing the inventive methods when the computer program product runs on a computer. In other words, the inventive methods are, therefore, a computer program having a program code for performing at least one of the inventive methods when the computer program runs on a computer.

In the following, the present invention will be summarized. It should be noted that there are different technical fields in which the present invention can be applied. For example, the present invention brings along advantages when capturing parallel outputted data from devices under test in an automated test equipment (ATE). Thus, the inventive concept may, for example, be applied when testing parallel analog-to-digital converters (ADC). More generally, it can be stated that the present invention can be advantageously applied whenever parallel protocols (or parallel communication protocols) are used. In other words, the testing of devices under test using parallel data transfer protocols can be improved or accelerated making use of the inventive concept.

Moreover, the inventive concept can also be applied when serial output data from a device under test is captured in an automated test equipment. For example, the inventive concept can be applied when operating on (or testing) serial analog-to-digital converters (ADC). More generally, the inventive concept can be used in an advantageous way whenever serial protocols or serial data transfer protocols are involved. To summarize, it can be stated that the present invention allows for a local and parallel computing of test results in an automated test equipment.

It should be noted here that the present invention brings along a plurality of aspects, which will be summarized in the following.

Regarding a first aspect, it should be noted that by using a match mechanism of ATE test systems it is possible to do a parallel capture, which leads to a situation that each channel has got the complete captured data. The match mechanism allows doing a conditional jump depending on an accumulated result of different channels A respective n-bit parallel capture algorithm has been described with reference to FIG. 6, wherein each bit (of bits "$bit_0$"-"$bit_n$") is captured by a digital channel (e.g. with different channel units). Applying the algorithm as described with reference to FIG. 6 (and also with reference to FIG. 8A) leads to combined data on all pins or combined data on all channel units, as described with reference to FIG. 3.

Each channel (i.e. each channel unit or each channel module) contains the complete data (i.e. data captured from multiple test pins of the device under test via multiple individual channel units or channel modules). This concept allows minimizing the test time, as it reduces the latency for starting an upload of capture data, as uploading data from a single channel is sufficient and uploading does not occur per channel;

enables local processing on each capture channel; no serial computation results is needed;

enables parallel processing of different algorithms on different channels, as each channel has the complete data;

allows uploading results only; e.g. results have a smaller size than capture data;

allows uploading combined pass fail results, for example by using the common channel mechanism which allows uploading an accumulated result; and allows applying captured data directly, as no serial upload and combining of data inside the workstation is needed.

To summarize the above advantages, data processing algorithms or test algorithms can be applied in parallel in the channel units or channel modules as soon as the necessitated data are available. As a result of the transfer of data between channels different algorithms can be applied in the different channel units or channel modules, according to an embodiment. Moreover, the results of different algorithms, at least some of which operate on more than one single bit of the data from the DUT, can be uploaded to a workstation in an efficient way. Moreover, the channel units may communicate, for example via the match line, to produce a pass-fail result making use only of channel units and not necessitating computational power of workstations. Moreover, in order to upload the data acquired from a plurality of test pins of the DUT, it is sufficient to upload only the memory content of a single channel unit to the workstation, as a single channel unit comprises in its memory the data captured by a plurality of channel units due to the inventive transfer of data between channel units. The transfer of a large amount of data from a single channel unit is more efficient than downloading the data from a plurality of channel units, as communication protocol overheads are reduced.

In the following, a second aspect of the present invention will be summarized. The second aspect has, for example, been explained with reference to the program listing of FIG. 7. It should be noted that the algorithm 700 of FIG. 7 is based on the algorithm 600 of FIG. 6. The algorithm 600 of FIG. 6 has been modified by adding channels to store the combined capture data on one or more additional channels. It should be noted that the expression "addChan" designates one or more additional channels, advantageously a group of channels. According to the second aspect of the present invention, the additional channel or the additional channels contain the complete data. This concept allows minimizing the test time for the following reasons:

The concept allows maximizing parallel processing of different algorithms on different channels, where each of the different algorithms can, for example, be executed on a different channel;

The concept allows uploading results only. For example, results have a smaller size than capture data.

The concept allows uploading combined pass-fail results, for example by using the common channel mechanism.

In other words, an additional data processing algorithm can be performed on the test processor of an additional channel wherein the additional channel is configured not to receive data from a GUT via a DUT connection pin.

In the following, a third aspect of the present invention will be described. According to the third aspect of the present invention, the algorithms described above with reference to FIGS. 6, 7, 8A and 8B can be modified by removing "store" operations from some channels. This allows optimizing a memory usage by minimizing the number of channels who have to store the waveform.

In the following, a fourth aspect of the present invention will be described. According to the fourth aspect, the algorithms described with reference to FIGS. 6, 7, 8A and 8B can be modified by removing the "store" operation for some bits, or for some rows. This allows optimizing a memory usage by skipping unnecessary bits. Moreover, the described concept improves a throughput of local processing by having aligned data in the memory of each channel.

In the following, an example of a parallel analog-to-digital converter test will be described. For testing, a parallel analog-to-digital converter, the following steps are applied:

A waveform is applied to the analog-to-digital converter. The waveform is, for example, output by an analog output or an analog input/output module of the test system, or by any other analog signal generator.

A parallel output (of the analog-to-digital converter) is captured by several digital channels (or channel units)

Several algorithms are applied to the combined capture data, for example algorithm for a calculation of an INL (incremental non-linearity), a DNL (differential non-linearity) or an SNR (signal-to-noise ratio).

According to the first aspect of the present invention, the captured data can be combined on several channels. Each channel has the complete data and is able to do local processing. So, on each channel a different algorithm can be executed in parallel. The results can be uploaded from each channel which executes and algorithm; or as a combined result by using the common channel mechanism.

In the following, an example for a serial analog-to-digital converter test will be described. For testing a serial analog-to-digital converter, the following steps are performed:

A waveform is applied to the analog-to-digital converter;

The serial output is captured by a single digital channel; and

Several algorithms are applied to the combined capture data, for example algorithms for calculating an INL, a DNL or an SNR.

With the algorithm according to the second aspect of the present invention it is possible to store the combined capture data on several channels. So, on each channel a different algorithm can be executed in parallel. The results can be uploaded:

from each channel which executes an algorithm; or as a combined result by using the common channel mechanism.

In the following, a serial stereo speaker output test will be described. For testing serial stereo output serial protocols are used, e.g.

n-bit words for left and right outputs are issued from the device; and additional protocol information may be issued, too.

According to the third aspect of the present invention, it is possible to skip unnecessary protocol information.

According to the fourth aspect of the present invention, it is possible to capture the data for the left and right output on different groups of channels. This allows applying several algorithms for left and right output data in parallel.

The results can be uploaded:

from each channel which executes an algorithm; or as a combined result by using the common channel mechanism.

In the following, the match mechanism of the tester will be summarized.

It should be noted that a test processor advantageously comprises a sequencer. The test processor is advantageously adapted to execute a sequencer instruction for doing conditional jumps. The sequencer instruction is, for example, designated with JMPC (Jump conditionally).

The JMPC instruction advantageously comprises the following features:

evaluates a condition and jumps if true;

jump address can be absolute or relative.

The condition for doing the jump is distributed inside the test system via a time sliced mechanism:

each channel belongs to a hardware site;

the pass/fail conditions of each channel are combined (ch1&&ch2&& ... &ch n) time-dependent on the configured hardware site.

The match mechanism has been described for example with reference to FIGS. 4 and 5.

In the following, a short summary of the aspects of the present invention will be given. It should be noted that the present invention is advantageously related to a use in-automated test equipment (ATE). The first aspect of the present invention comprises, according to an embodiment of the present invention, the following concepts:

n-bit capture of device under test output (n ∈ {1, 2, ..., ∞});

single site/multi-site;

combining data of different channels;

applying different algorithms on the same capture data in parallel;

independent of test type (e.g. analog, digital, RF).

The second aspect of the present invention, according to an embodiment of the present invention, comprises the following concepts:

n-bit capture of device under test output (n ∈ {1, 2, ..., ∞});

single site/multi-site;

combining data of different channels;

applying different algorithms on the same capture data in parallel;

maximizing parallelism;

independent of test type (e.g. analog, digital, RF).

The third aspect of the present invention, according to an embodiment of the present invention, comprises the following concepts:

n-bit capture of device under test output ($n \in \{1, 2, \ldots, \infty\}$);
single site/multi-site;
combining data of different channels;
applying different algorithms on the same capture data in parallel;
minimizing memory consumption;
independent of test type (e.g. analog, digital, RF).

The fourth aspect of the present invention, according to an embodiment of the present invention, comprises the following concepts:

n-bit capture of device under test output ($n \in \{1, 2, \ldots, \infty\}$;
single site/multi-site;
combining data of different channels;
minimizing memory consumption;
alignment of captured data in memory by skipping bits;
independent of test type (e.g. analog, digital, RF).

According to another aspect of the present invention or method, a combination of data takes place while a device under test is being tested. In other words, copying (data) is not a downstream process (device test and then copying the data) consuming extra time.

In other words, the inventive concept departs from the conventional approach of testing a device first and copying data (to a workstation) afterwards.

So exchanging data between the channel units and inputting and/or outputting data from/to the device is performed concurrently or in parallel. Alternatively, data input or data output to the device under test and the exchange of data between the channel units may be performed alternatingly. Consequently, it is not necessary to perform a full test program defining interactions between the channel unit and the DUT before exchanging data between the channel units. Rather, the test program may, in an embodiment of the present invention, define an alternation of interactions between the DUT and the channel unit on the one hand and an exchange of data between channel units on the other hand.

Regarding the execution of test algorithms (e.g. the calculation of a DNL value or an INL value), a local evaluation (performed, for example, by the test processors in the channel units) can start before the whole waveform has been captured, according to another aspect of the present invention. In other words, in some cases (DNL/INL) the local evaluation can start already, although the waveform has not yet been captured completely. In other words, as soon a portion of the waveform has been captured from the DUT (e.g. by one or more channel units), the calculation can be started in the channel units. This is possible, as the exchange of the captured data between the channel units is advantageously effected before the capture of full the waveform is completed.

To summarize the above, a particularly efficient concept has been described which allows a parallel processing of different test algorithms in individual (e.g. single-channel) channel units.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. A tester for testing a device under test, the tester comprising:
a first channel unit comprising a corresponding first pin connection for a signal from a device under test, a corresponding first test processor adapted to process data received from the first pin connection, and a corresponding first memory coupled with the first test processor and adapted to store data provided by the first test processor; and
a second channel unit;
wherein the first channel unit is adapted to transfer at least a part of the data received from the first pin connection to the second channel unit as transfer data, and
wherein the second channel unit comprises a corresponding second test processor adapted to process the transfer data from the first channel unit.

2. The tester of claim 1, wherein the second channel unit comprises a second pin connection, and
wherein the second test processor is adapted to process, in a combining way data received from the second pin connection and the transfer data transferred from the first channel unit to the second channel unit.

3. The tester of claim 2, wherein the second channel unit is adapted to transfer at least a part of the data received from the second pin connection to the first channel unit as second transfer data, and
wherein the first test processor is adapted to process the second transfer data from the second channel unit using conditional branch instructions and memory access instructions defined in a corresponding test program.

4. The tester of claim 3, wherein the first test processor is adapted to process, in a combining way, data received from the first pin connection and the second transfer data transferred from the second channel unit to the first channel unit.

5. The tester of claim 1, wherein the second test processor is adapted to process only pin data transferred to the second channel unit from a channel unit other than the second channel unit.

6. The tester of claim 5, wherein the second channel unit comprises a second pin connection, wherein the second pin connection is unconnected, or wherein the second test processor is adapted not to process data from the second pin connection.

7. The tester of claim 1, wherein the first channel unit is adapted to transfer only a subset of the data received from the first pin connection to the second channel unit.

8. The tester of claim 1, wherein the first channel unit and the second channel unit are both coupled to a common match line,
wherein the first test processor is adapted to transfer the transfer data to the second channel unit via the match line.

9. The tester of claim 8, wherein the second channel unit comprises a second pin connection, and wherein the second test processor is adapted to transfer data received from the second pin connection to the first channel unit via the match line.

10. The tester of claim 1, wherein the first channel unit and the second channel unit are coupled to a match line, wherein the match line realizes a wired OR logic function or a wired AND logic function,
wherein the first test processor and the second test processor are time-synchronized;
wherein the first test processor is adapted to apply a data sample to the match line in a first synchronization time interval;

wherein the second test processor is adapted to behave neutrally with respect to the state of the match line within the first synchronization time interval and to determine a data sample of the transfer data from the first channel unit in dependence on the state of the match line in the first synchronization time interval.

11. The tester of claim 10, wherein the second test processor is adapted to store the data sample of the transfer data from the first channel unit in a second memory.

12. The tester of claim 10, wherein the second test processor is adapted to apply a data sample to the match line in a second synchronization time interval;
wherein the first test processor is adapted to behave neutrally with respect to the state of the match line in the second synchronization time interval, and to determine a data sample of a second transfer data from the second channel unit in dependence on the state of the match line in the second synchronization time interval.

13. The tester of claim 12, wherein the first test processor is adapted to write the determined data sample of the second transfer data from the second channel unit to the first memory.

14. The tester of claim 11, further comprising:
a third channel unit, the third channel unit comprising a corresponding third pin connection for a signal from the DUT, a corresponding third test processor and a corresponding third memory coupled with the third test processor and adapted to store data provided by the third test processor;
wherein the first channel unit is adapted to transfer the first transfer data received from the first pin connection to the second channel unit and to the third channel unit;
wherein the second channel unit is adapted to transfer second transfer data received from a second pin connection to the first channel unit and to the third channel unit; and
wherein the third channel unit is adapted to transfer third transfer data received from the third pin connection to the first channel unit and to the second channel unit;
wherein the third channel unit is coupled to the match line;
wherein the third test processor is time-synchronized with the first test processor and the second test processor; and
wherein the third test processor is adapted to behave neutrally with respect to the state of the match line in a first synchronization time interval and to determine a data sample of the first transfer data in dependence on the state of the match line in the first synchronization time interval;
wherein the second test processor is adapted to apply a data sample of the second transfer data to the match line in a second synchronization time interval;
wherein the first test processor is adapted to behave neutrally with respect to the state of the match line in the second synchronization time interval and to determine a data sample of the second transfer data from the second channel unit in dependence on the state of the match line in the second synchronization time interval;
wherein the third test processor is adapted to behave neutrally with respect to the state of the match line in the second synchronization time interval and to determine a data sample of the second transfer data from the second channel unit in dependence on the state of the match line in the second synchronization time interval; and
wherein the third test processor is adapted to apply a data sample of the third transfer data to the match line in a third synchronization time interval;
wherein the first test processor is adapted to behave neutrally with respect to the state of the match line in the third synchronization time interval and to determine a data sample of the third transfer data from the third channel unit in dependence on the state of the match line in the third synchronization time interval; and
wherein the second test processor is adapted to behave neutrally with respect to the state of the match line in the third synchronization time interval and to determine a data sample of the third transfer data from the third channel unit in dependence on the state of the match line in the third synchronization time interval.

15. The tester of claim 11, further comprising:
a third channel unit, the third channel unit comprising a corresponding third test processor and a corresponding third memory coupled with the third test processor and adapted to store data provided by the third test processor;
wherein the first channel unit is adapted to transfer the first transfer data received from the first pin connection to the second channel unit and to the third channel unit; and
wherein the second channel unit is adapted to transfer second transfer data received from a second pin connection to the first channel unit and to the third channel unit;
wherein the third channel unit is coupled to the match line;
wherein the third test processor is time-synchronized with the first test processor and the second test processor; and
wherein the third test processor is adapted to behave neutrally with respect to the state of the match line in a first synchronization time interval and to determine a data sample of the first transfer data in dependence on the state of the match line in the first synchronization time interval;
wherein the second test processor is adapted to apply a data sample of the second transfer data to the match line in a second synchronization time interval;
wherein the first test processor is adapted to behave neutrally with respect to the state of the match line in the second synchronization time interval and to determine a data sample of the second transfer data from the second channel unit in dependence on the state of the match line in the second synchronization time interval; and
wherein the third test processor is adapted to behave neutrally with respect to the state of the match line in the second synchronization time interval and to determine a data sample of the second transfer data from the second channel unit in dependence on the state of the match line in the second synchronization time interval.

16. The tester of claim 11, further comprising:
a third channel unit, the third channel unit comprising a corresponding third pin connection for a signal from the DUT, a corresponding third test processor and a corresponding third memory coupled with the third test processor and adapted to store data provided by the third test processor;
wherein the first channel unit is adapted to transfer the first transfer data received from the first pin connection to the second channel unit;
wherein the second channel unit is adapted to transfer second transfer data received from a second pin connection to the first channel unit; and
wherein the third channel unit is adapted to transfer third transfer data received from the third pin connection to the first channel unit and to the second channel unit;
wherein the third channel unit is coupled to the match line;
wherein the third test processor is time-synchronized with the first test processor and the second test processor; and
wherein the third test processor is adapted to behave neutrally with respect to the state of the match line in a first synchronization time interval;

wherein the second test processor is adapted to apply a data sample of the second transfer data to the match line in a second synchronization time interval;

wherein the first test processor is adapted to behave neutrally with respect to the state of the match line in the second synchronization time interval and to determine a data sample of the second transfer data from the second channel unit in dependence on the state of the match line in the second synchronization time interval;

wherein the third test processor is adapted to behave neutrally with respect to the state of the match line in the second synchronization time interval; and wherein the third test processor is adapted to apply a data sample of the third transfer data to the match line in a third synchronization time interval;

wherein the first test processor is adapted to behave neutrally with respect to the state of the match line in the third synchronization time interval and to determine a data sample of the third transfer data from the third channel unit in dependence on the state of the match line in the third synchronization time interval; and wherein the second test processor is adapted to behave neutrally with respect to the state of the match line in the third synchronization time interval and to determine a data sample of the third transfer data from the third channel unit in dependence on the state of the match line in the third synchronization time interval.

17. The tester of claim 10, wherein the channel units of a plurality of hardware sites are coupled to the match line, wherein channel units of a first hardware site are adapted to access the match line during time intervals of a first set of time intervals; and wherein channel units of a second hardware site are adapted to access the match line during time intervals of a second set of time intervals, wherein the time intervals of the first set of time intervals are non-overlapping with the time intervals of the second set of time intervals.

18. The tester of claim 1, wherein the second channel unit comprises a second pin connection, wherein the first test processor is adapted to perform a first test algorithm using data received from the second pin connection.

19. The tester of claim 18, wherein the first test processor is adapted to perform the first test algorithm using data received both from the second pin connection and from the first pin connection.

20. The tester of claim 1, wherein the first test processor and the second test processor are adapted to perform different test algorithms simultaneously, each of the different algorithms using data received from the first connection pin of the first channel unit.

21. The tester of claim 1, wherein the first test processor and the second test processor are adapted to perform different test algorithms simultaneously, each of the different algorithms using data received from a plurality of connection pins of a plurality of channel units.

22. The tester of claim 1, wherein the first test processor is adapted to process the data received from the first pin connection making use of conditional branch instructions and memory access instructions defined in a test program associated with the first test processor; and wherein the second test processor is adapted to process the transfer data from the first channel unit making use of conditional branch instructions and memory access instructions defined in a corresponding test program.

23. A method for testing a device under test, the method comprising:

receiving data from a first pin connection of a first channel unit to the device under test;

transferring at least a part of the data received from the first pin connection to a second channel unit as transfer data;

processing data received from the first pin connection in a test processor of the first channel unit; and processing the transfer data from the first channel unit in a test processor of the second channel unit.

24. A non-transitory computer-readable medium having stored thereon a computer program for performing, when the computer program runs on a computer, a method for testing a device under test, the method comprising:

receiving data from a first pin connection of a first channel unit to the device under test;

transferring at least a part of the data received from the first pin connection to a second channel unit as transfer data;

processing data received from the first pin connection in a test processor of the first channel unit; and processing the transfer data from the first channel unit in a test processor of the second channel unit.

* * * * *